United States Patent [19]

Tateyama et al.

[11] Patent Number: 5,239,182
[45] Date of Patent: Aug. 24, 1993

[54] WAFER CONVEYOR APPARATUS AND METHOD FOR DETECTING INCLINATION OF WAFER INSIDE CASSETTE

[75] Inventors: Kiyohisa Tateyama; Yasuhiro Sakamoto, both of Kumamoto, Japan

[73] Assignee: Tokyo Electron Saga Kabushiki Kaisha, Tokyo, Japan

[21] Appl. No.: 868,874

[22] Filed: Apr. 16, 1992

[30] Foreign Application Priority Data

Apr. 19, 1991 [JP] Japan .................... 3-117017

[51] Int. Cl.$^5$ ............................................. G01V 9/04
[52] U.S. Cl. ................................... 250/561; 414/416; 414/331; 414/937
[58] Field of Search ........... 250/561, 548, 557, 223 R; 356/400; 414/416, 331, 281, DIG. 3, 937

[56] References Cited

U.S. PATENT DOCUMENTS 4,786,816  11/1988  Ohmori et al. ...................... 250/561
4,803,373   2/1989  Imamura et al. .................. 250/222.1
4,984,954   1/1991  Warenback et al. ................ 414/416
5,003,188   3/1991  Igari ................................... 250/561

*Primary Examiner*—David C. Nelms
*Assistant Examiner*—Que T. Le
*Attorney, Agent, or Firm*—Beveridge, DeGrandi, Weilacher & Young

[57] ABSTRACT

A wafer conveyor apparatus which moves a wafer moving device which moves wafers housed in a wafer cassette and performs conveyance the wafers, comprises a first arm provided with a light emitting device, a second arm provided with a light receiving device that detects light emitted from the light emitting device, and a wafer detector that has a judgment device for judging the presence or absence or a housing status of a wafer inside a wafer cassette on the basis of the output information of the light receiving device. In addition, the first arm provided to a conveyor platform and having the light emitting device provided at its distal end and the second arm provided to the conveyor platform and having the light receiving device provided at its distal end, are moved and positioned above and below an outside of an outer peripheral side of the wafer, and the first arm and the second arm are moved in a direction of the thickness of the wafer, light is irradiated from the light emitting device and the light is detected by the light receiving device to measure an apparent thickness of the wafer. Then, the apparent thickness of the wafer as obtained by measurement is compared with an actual thickness of the wafer and an inclination of a housed wafer is detected, and depending upon a detected inclination of the wafer, the wafer is either moved, the housing of the wafer corrected, or alarm processing is performed.

11 Claims, 9 Drawing Sheets

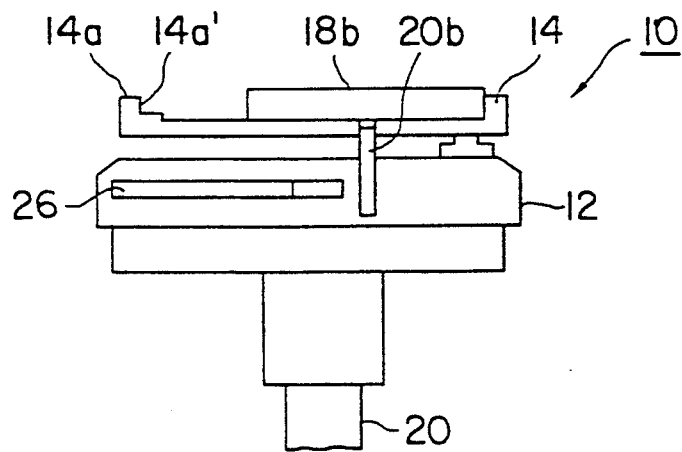
F I G. 5A
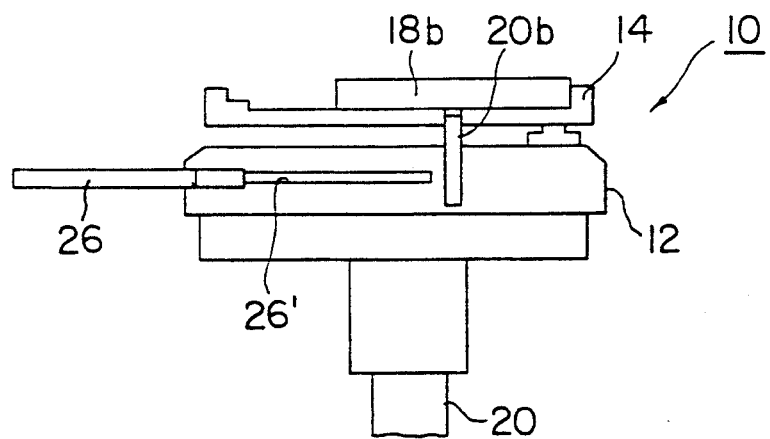
F I G. 5B

WAFER CONVEYOR APPARATUS AND METHOD FOR DETECTING INCLINATION OF WAFER INSIDE CASSETTE

BACKGROUND OF THE INVENTION

The present invention relates to a wafer conveyor apparatus and a method for detecting the inclination of a wafer inside a wafer cassette which houses wafers, and for performing either wafer mount or alarm processing.

Conventionally, there are known many types of apparatus which, for example, take semiconductor wafers one at a time from a wafer cassette which houses a plural number of semiconductor wafers (such as 25 pieces, for example) and conveys them to a next process.

Not only this, such known wafer conveyor apparatus are provided with a gripper to a conveyor platform and the semiconductor wafer is loaded to the upper surface of the gripper and is held by it, and this status is maintained while the conveyor platform is moved so as to advance and retreat to and from the cassette and take the semiconductor wafers.

The following is a description of the case when such a conventional wafer conveyor apparatus is used to take semiconductor wafers housed in a wafer cassette, from that cassette.

As shown in the partial longitudinal sectional view of FIG. 13, a moving means (not shown) moves the wafer conveyor apparatus 10 in the direction of housing of the semiconductor wafers 60, and the gripper 14 which is mounted to the conveyor platform 12 are inserted between the semiconductor wafers 60 and the lower side of the semiconductor wafers 60 housed in the wafer cassette 40. After this, this status is maintained while a raising and lowering means (not shown) raises the conveyor platform 12 so that the gripper 14 is raised and the holding surface of the gripper 14 loads and holds the semiconductor wafer 60. Then, the wafer conveyor apparatus 10 is retreated from the wafer cassette 40 so that the semiconductor wafers 60 can be taken out one at a time. Moreover, as shown in the longitudinal sectional view of the wafer cassette 40 in FIG. 14, each of the semiconductor wafers 60 stored in the wafer cassette 40 is inserted into each step of the grooves 40a formed in the surfaces of the inner sides of both of the side walls of the wafer cassette 40 but there are slight discrepancies in the horizontal status of the semiconductor wafers 60 and they are housed inclined to to the grooves 40a.

Because of this, when the semiconductor wafers 60 are taken from the wafer cassette 40 by an automated wafer conveyor apparatus 10 as the means described above, there must first be prior confirmation that there is a semiconductor wafer 60 stored in each of the steps of the grooves 40a inside the wafer cassette 40. In order to do this, a conventional wafer conveyor apparatus is provided with a sensor means or the like for irradiating a light beam in the direction of wafer conveyance and also in the forward and rear directions of a wafer cassette 40 and so detect whether or not there is a semiconductor wafer 60 housed as expected inside the wafer cassette 40.

However, normally, many wafer cassettes 40 are used with respect to the one semiconductor manufacturing apparatus and, therefore, there is the problem that a sensor means must be provided for each wafer cassette 40 and that the cost of the entire semiconductor apparatus becomes extremely high.

In addition, as has been described above, the wafer cassette 40 is configured so that the semiconductor wafers 60 are inserted into, and stored in each step of the grooves 40a formed in the inner side surfaces of both of the side walls and so as shown by the reference numerals 60a and 60b of FIG. 14, the semiconductor wafers 60 may be inserted and housed at a slight angle.

Assuming that the wafers are at regulated positions at a fixed pitch and the sensor normally moves from the bottom to the top of the wafer cassette according to the number of semiconductor wafers housed, in a so-called mapping method when there is detection for whether or not there is a semiconductor wafer housed inside the grooves in the wafer cassette, the height or the protrusion (insertion) of the grippers for taking out the semiconductor wafer is normally constant with respect to the grooves of the wafer cassette.

Therefore, in cases such as these, when the semiconductor wafers 60a, 60b are held and taken out from the wafer cassette 40 by an automated wafer conveyor apparatus 10, there is the problem that the strong rubbing against the surface of the grooves 40a into which the semiconductor wafers 60a, 60b are inserted generates dust.

Furthermore, in the worst case, there is also the danger that the semiconductor wafer itself may break.

In the light of the problems associated with a conventional wafer conveyor apparatus, the present invention has as an object the provision of a wafer conveyor apparatus that can detect the presence or absence of a semiconductor wafer inside a wafer cassette and which is to be conveyed, and a method using this wafer conveyor apparatus for performing the detection of the inclination of a wafer inside the wafer cassette.

SUMMARY OF THE INVENTION

The waver conveyor apparatus of the present invention moves a wafer holding means which holds a wafer and performs the conveyance of wafers housed inside a wafer cassette, and is provided with a first arm provided with a light emitting means, a second arm provided with a light receiving means that detects light emitted from the light emitting means, both of these arms being mounted to a conveyor platform, and a wafer detection means that has a judgment means for judging the presence or absence or a housing status of a wafer inside a wafer cassette on the basis of the output information of the light receiving means.

In addition, the method for using the wafer conveyor apparatus to detect the inclination of a wafer inside the wafer cassette moves the first arm and the second arm for each conveyor platform so that the first arm provided with the light emitting means and the second arm provided with the light receiving means are positioned at either the top or the bottom of the outer side of the outer peripheral surface of the wafer. After this, the first arm and the second arm are moved relative to the direction of the thickness of the wafer and light is irradiated. This light is then detected by the light receiving means, and the apparent thickness of the wafer is measured, and this apparent thickness of the wafer obtained by this measurement process and the actual thickness of the wafer are compared to detect the inclination of the stored wafer. These detection results are used as the basis for either moving the wafer in that status, moving it after fine adjustment has been performed, or for performing alarm processing.

In the wafer conveyor apparatus of the present invention, a first arm (light emitting arm) and a second arm (light receiving arm) mounted to a conveyor platform, are inserted into the wafer cassette so as to sandwich a region in which a wafer should be present and parallel light is irradiated from the left and right directions of the storage status of the wafer and detection operation is performed. Then, when there is a wafer present between the light emitting means and the light receiving means, the light that is irradiated from the light emitting means is blocked by the wafer and so it is possible to detect whether a wafer is present, or the status of storage of the wafer.

In addition, in the method using this wafer conveyor apparatus for the detection of the inclination of a wafer, the first arm and the second arm which are the wafer detection means are positioned on the outer side of the outer peripheral surface of the wafer and then the first arm and the second arm are moved in the direction of the thickness of the wafer. Light is then irradiated from the light emitting means and the apparent thickness of the wafer is measured by the distance of movement of the wafer detection means in the up and down direction between when the light is no longer detected by the light receiving means, until it is detected once again. Then, when this apparent thickness is larger than the actual thickness of the wafer, it is judged that the wafer is housed in the wafer cassette in an inclined status, and then there is either fine adjustment for the height of insertion of the gripper for taking out the semiconductor wafer, or alarm processing if fine adjustment is not sufficient.

BRIEF DESCRIPTION OF THE DRAWINGS

FIGS. 5A-5B are side views of the wafer conveyor apparatus shown in FIG. 3, with FIG. 5A showing the status where the first arm and the second arm are retreated, and FIG. 5B showing the status where the gripper has advanced in the direction of housing of the wafer;

DETAILED DESCRIPTION OF THE PREFERRED EMBODIMENTS

Figure 1:
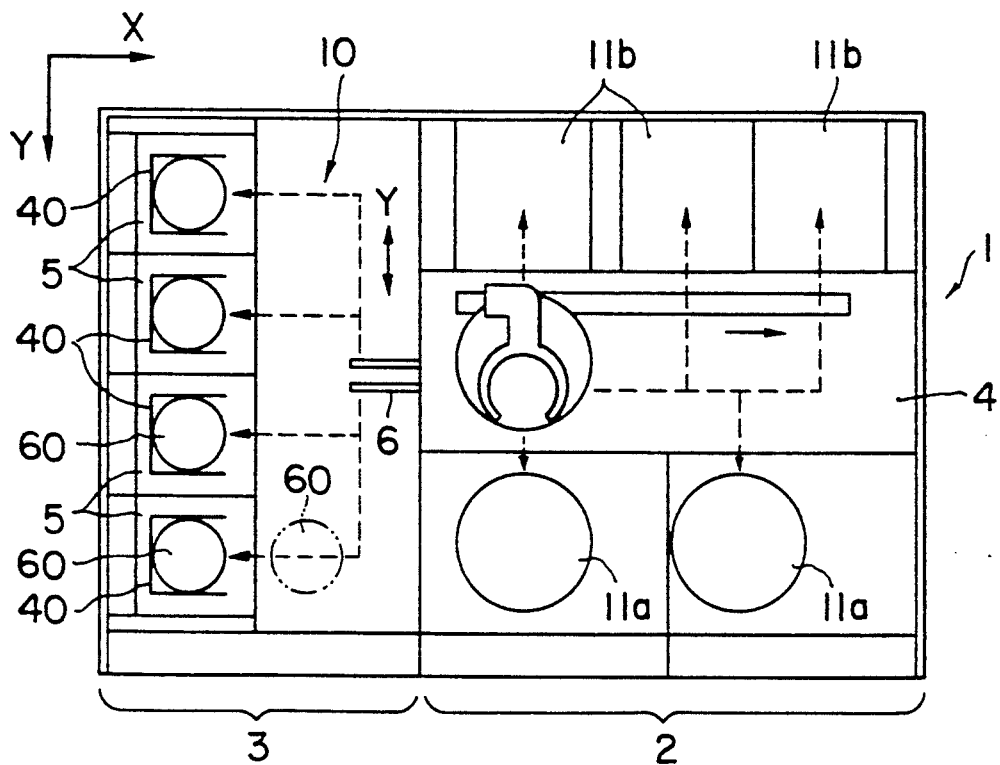
FIG. 1 is a plan view of a semiconductor manufacturing apparatus to which the wafer conveyor apparatus of the present invention has been applied.
Figure 2:
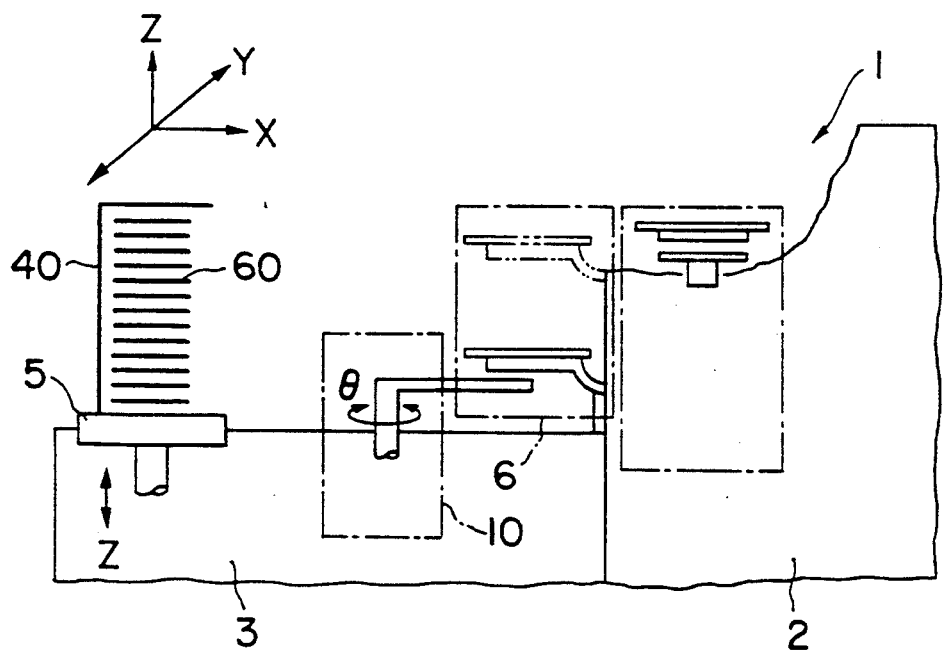
FIG. 2 is a perspective side view of the semiconductor manufacturing apparatus of FIG. 1.

FIG. 1 and FIG. 2 are respectively, a plan view and a perspective side view of a semiconductor manufacturing apparatus to which the wafer conveyor apparatus of the present invention has been applied.

As shown in FIG. 1 and FIG. 2, a semiconductor manufacturing apparatus such as a resist application and development processing apparatus 1 is configured with a processing portion 2 and a loader portion 3 having separated housings arranged and connected in a line in the horizontal direction.

In this resist application and development processing apparatus 1, the processing portion 2 includes an object to be processed, and which is configured from each processing units 11a, 11b that implement a series of processes for photolithography to the semiconductor wafers 60 for example, and a conveyor unit 4 that conveys the semiconductor wafers 60 to each of these processing units 11a, 11b.

The loader portion 3 has the wafer cassette 40 which is configured so that a plural number, such as 25 pieces for example, semiconductor wafers 60 can be housed, is mounted to a cassette mounting portion 5. The cassette mounting portion 5 can be moved in the up and down directions (the direction of the Z axis) by another drive means (not shown). In addition, the wafer conveyor apparatus 10 is arranged with respect to the loader portion 3 so that this loader portion 3 can carry the semiconductor wafers 60 to and from the wafer cassette 40 by the operation of wafer gripper which is freely movable in the X, Y, Z and θ directions. Furthermore, this loader portion 3 is provided with a wafer receiving and transfer mechanism 6 which performs the receiving and transfer of the semiconductor wafers 60 from the wafer conveyor apparatus 10 to the conveyor unit 4.

The following is a description of an embodiment of the wafer conveyor apparatus 10 of the present invention and which has been applied to such a semiconductor manufacturing apparatus, and with reference to the appended figures.

Figure 3:
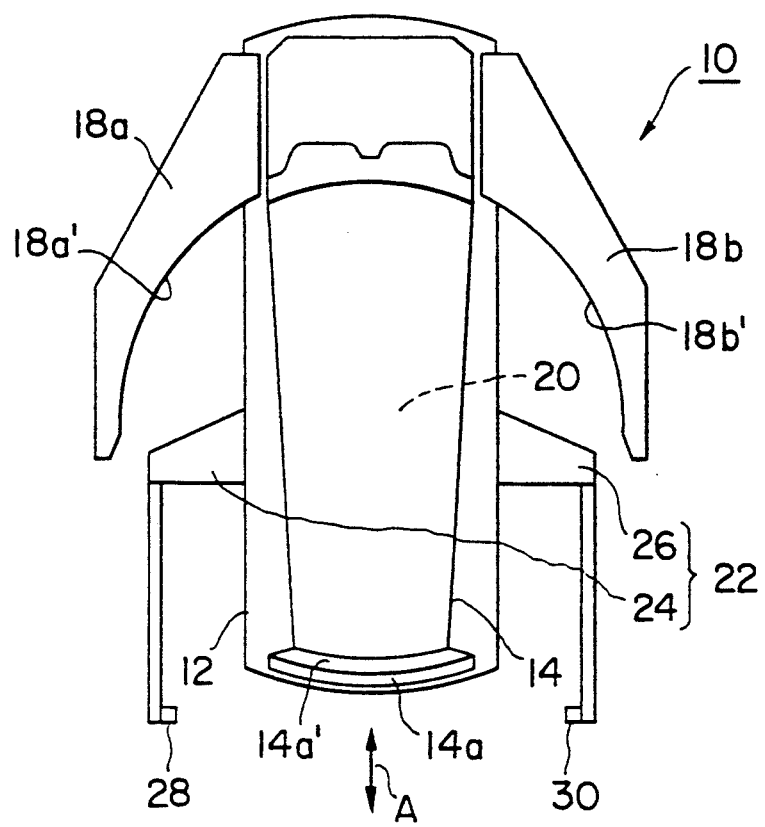
FIG. 3 is a plan view of a first embodiment of the wafer conveyor apparatus of the present invention.
Figure 4:
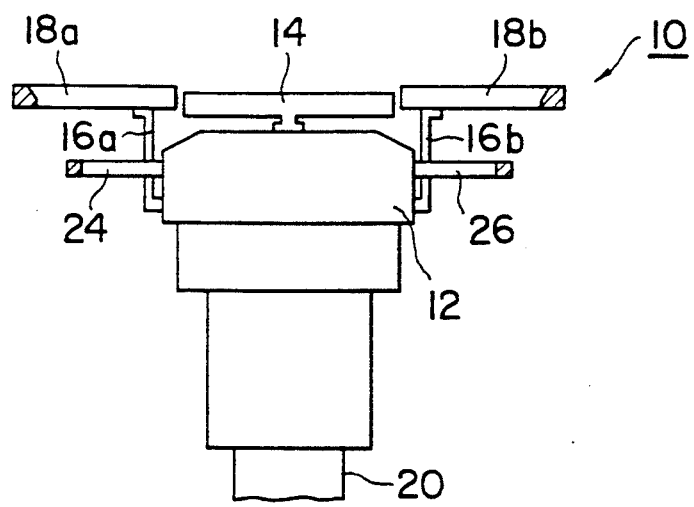
FIG. 4 is a front view of the wafer conveyor apparatus shown in FIG. 3.

As shown in FIG. 3 and FIG. 4, the wafer conveyor apparatus 10 of the present invention includes a conveyor platform 12 which is mounted to a raising and lowering rod 20, a gripper that functions as a wafer holding means and which is configured so as to mount the semiconductor wafers 60 on its upper surface, wafer centering members 18a, 18b which are supported by mounting fittings 16a, 16b which have one end mounted to the conveyor platform 12, and a wafer detection mechanism 22. A mechanism (to be described later with reference to FIG. 10) freely moves the raising and lowering rod 20 in the directions of the X and Y axes shown in FIG. 2, and also in the direction of the Z axis and the direction $\theta$.

In addition, the gripper 14 is configured so that it can advance and retreat with respect to the direction of the length of the conveyor platform, in the direction shown by the letter A in FIG. 3. The gripper 14 is advanced and is inserted in the non-contact status to the lower side of the semiconductor wafers 60 which are stored in the step portion (groove) of the wafer cassette 40, and then the raising and lowering rod 20 is used to raise the gripper 14 so that the semiconductor wafers 60 are loaded on top of the gripper 14. Furthermore, this gripper 14 is moved and advanced to the side of the conveyor platform 12 and the inner surface side $14a'$ of the step portion $14a$ formed in the distal end portion of the gripper 14 and the curved inner side surfaces $18a'$, $18b'$ of the wafer centering members $18a$, $18b$ mounted to the conveyor platform 12 center and hold the outer peripheral surfaces of the semiconductor wafers 60 for the next process.

Figure 7:
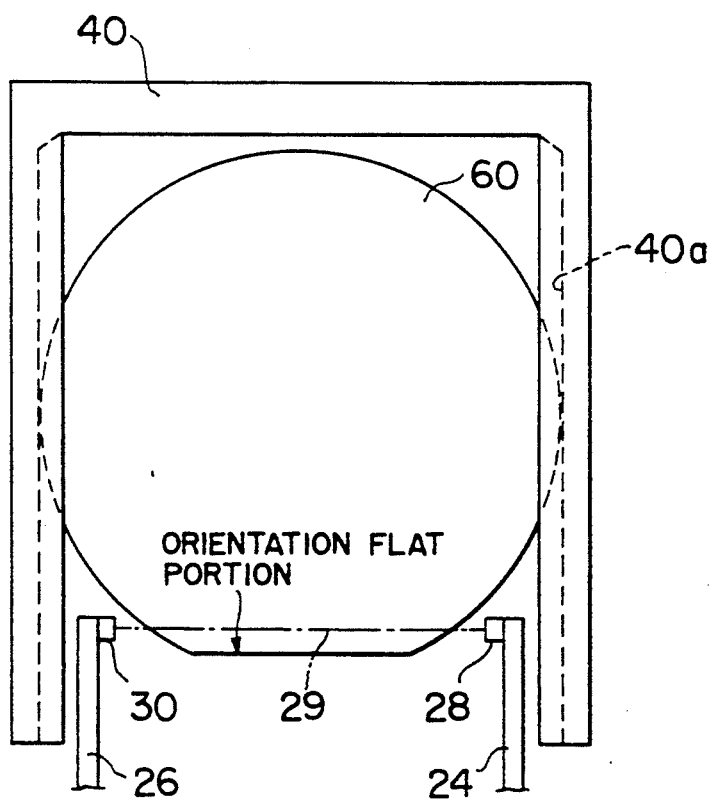

In addition, a wafer detection mechanism 22 (i.e. a sensor) is configured from a first arm 24 which is provided at its distal end with a light emitting element 28 (such as optical systems that incorporate lenses and semiconductor lasers, and LED: Light Emitting Diode) as the light emitting means, a second arm 26 provided at its distal end with a light receiving element 30 as the light receiving means, and a judgment circuit to be described later. These first arm 24 and second arm 26 are arranged at a position below the gripper 14 and as shown in FIG. 4, and are configured so that they can move advance and retreat in the direction indicated by the letter A in FIG. 3, and independently of the movement of the gripper 14. More specifically, the first arm 24 and the second arm 26 are configured so that the semiconductor wafers 60 are detected from the left and right directions with respect to the direction of movement of the gripper 14 for taking out the wafers. In addition, as shown in FIG. 7, the gap between the distal end portions of the first arm 24 and the second arm 26 is narrower than the diameter of the semiconductor wafers 60 for example, that is, the gap into which it is possible to advance into the wafer cassette 40. Accordingly, as shown in FIG. 7, the light beam 29 for wafer detection is irradiated in the left and right directions and detects the semiconductor wafer 60.

FIG. 5 is a side view of the wafer conveyor apparatus 10, with FIG. 5A showing the status where the first arm 24 and the second arm 26 are retreated, and FIG. 5B showing the status where the second arm 26 is in the status where it has advanced along the guide groove $26'$.

Here, the following description will be given of the method of detecting the presence or the inclination of a semiconductor wafer 60 housed in the wafer cassette 40, for the case where a wafer detection mechanism 22 such as this is used.

Figure 6:
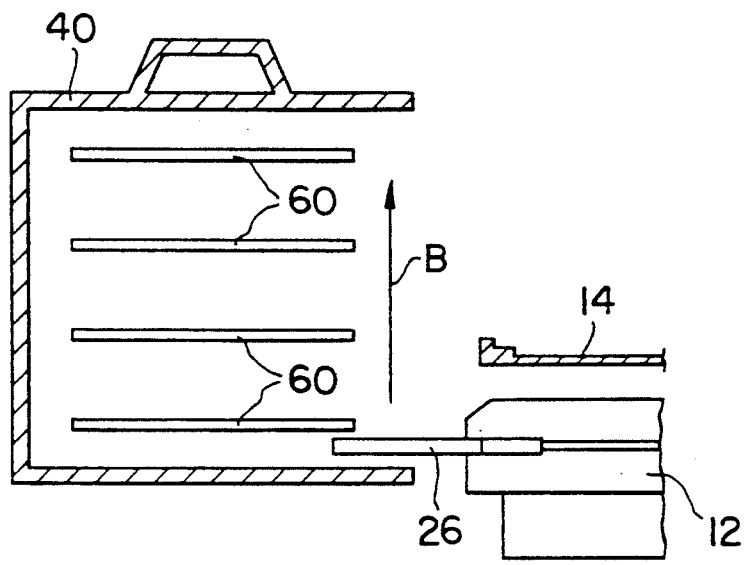
FIG. 6 and FIG. 7 are views for describing the operation of the wafer conveyor apparatus shown in FIG. 3, with FIG. 6 being a longitudinal sectional view of the wafer cassette portion, and FIG. 7 being a lateral sectional view of the wafer cassette portion.

First, as shown in FIG. 6 and FIG. 7, the first arm 24 and second arm 26 are advanced and are inserted into the wafer cassette 40 below the height of the semiconductor wafer 60 that is housed in the bottommost step of the wafer cassette 40.

When this occurs, there is no semiconductor wafer 60 present between the light emitting element 28 and the light receiving element 30 and so the light beam 29 from the light emitting element 28 reaches the light receiving element 30. As a result, it is judged that there is no wafer 60 present.

After this, the raising and lowering rod 20 is used to raise the first arm 24 and the second arm 26 in the direction indicated by the letter B. Here, when the first arm 24 and the second arm 26 are raised to the height of the semiconductor wafer 60 housed in the lowest step of the wafer cassette 40, the light beam 29 from the light emitting element 28 is interrupted by the outer peripheral surface of the semiconductor wafer 60, and which is closest to the wafer conveyor apparatus 10, and there is no detection by the light receiving element 30, and there is the output of output information for wafer detect. This output information is used for the judgment circuit of the wafer detection mechanism 22 to detect that there is a semiconductor wafer 60 housed in the lowest step of the wafer cassette 40. After this, the first arm 24 and the second arm 26 are raised to a height of the highest housing position of the wafer cassette 40 and the detection of the left/right and forward/rear inclination, and judgment of wafer presence (i.e. mapping) is performed for each step inside the wafer cassette 40.

As has been described above and as shown in FIG. 3, the wafer detection mechanism 22 is provided to the side of the wafer conveyor apparatus 10 and so even if there are many wafer cassettes 40, there need only be one wafer detection mechanism 22. Also, there is absolutely no necessity to separately provide a detection means such as a light reflecting unit for example, to the side of the wafer cassette 40.

In addition, when there is mapping, whether or not the semiconductor wafers 60 are correctly housed in the horizontal direction in the grooves 40 of each step inside the wafer cassette 40, or whether they are housed at an incline can be judged by measuring the apparent thickness of the semiconductor wafers 60.

Figure 8A:
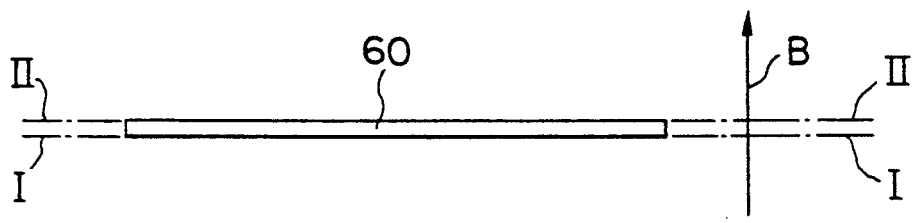
FIGS. 8A-8B are conceptual views for describing the principle for detection of the presence of semiconductor wafer inclination using the wafer conveyor apparatus shown in FIG. 3, with FIG. 8A showing the case for when the semiconductor wafer is stored horizontally inside the wafer cassette, and FIG. 8B showing the case for when the semiconductor wafer is stored inclined inside the wafer cassette.

For example, when the semiconductor wafers 60 are correctly housed in the horizontal direction inside the wafer cassette 40, the first arm 24 and the second arm 26 rise as shown by the letter B in FIG. 8A. When this occurs, the light from the light emitting element 28 is not detected by the light receiving element 30 from the time the first arm 24 and the second arm 26 has reached the height shown by I until they have reached the height shown by II. Accordingly, during the time that the light beam 29 from the light emitting element 28 is not being detected by the light receiving element 30, the distance that the first arm 24 and the second arm 26 move upwards is in agreement with the actual thickness of the semiconductor wafer 60.

Figure 8B:
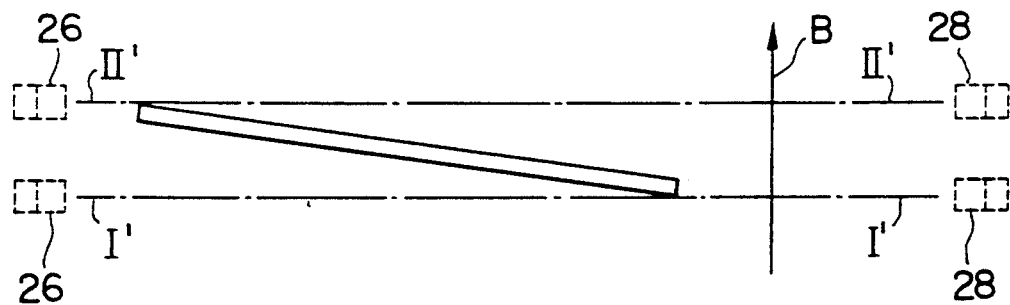

On the other hand, when a semiconductor wafer 60 is housed in the wafer cassette 40 in an inclined status, then as shown in FIG. 8B, the light from the light emitting element 28 is not detected by the light receiving element 30 for from when the first arm 24 and the second arm 26 have reached the height shown by I', until they have reached the height shown by II'. Accordingly, the distance that the first arm 24 and the second arm 26 move during this time is longer than the case shown in FIG. 8A, and is not in agreement with the actual thickness of the semiconductor wafer 60. More specifically, the apparent thickness of the semiconductor wafer 60 is detected.

Accordingly, in the judgment circuit of the wafer detection mechanism 22, the apparent thickness of the semiconductor wafer 60 obtained by such a judgment is compared with an actual thickness of a semiconductor wafer as has been measured beforehand so that it is possible to detect whether or not a semiconductor wafer 60 is housed in the horizontal direction or in an inclined status.

Figure 9:
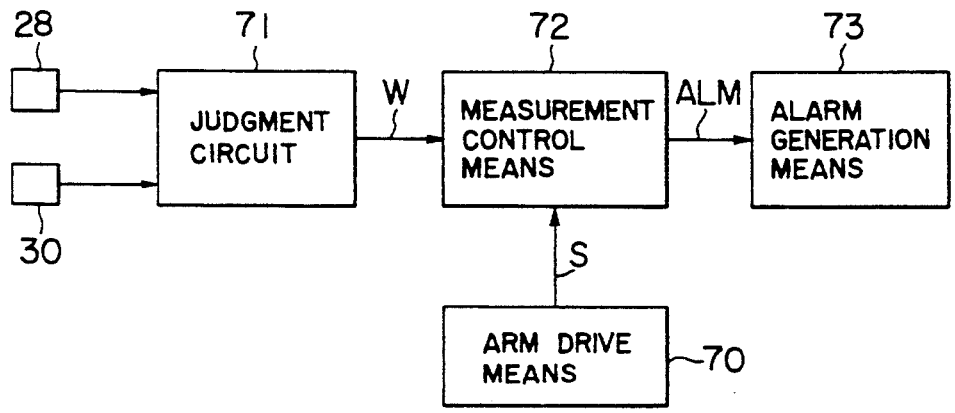
FIG. 9 is a block diagram for describing the circuit of the wafer detection mechanism for measurement of the semiconductor wafer inclination using the wafer conveyor apparatus shown in FIG. 3.

For example, as shown in FIG. 9, the arm drive means 70 that moves the raising and lowering rod 20 in the up and down directions so as to move the first arm 24 and the second arm 26 in the up and down directions outputs electrical signals that generate one pulse for each movement of the arm by 0.01 mm in the direction of the Z axis.

In the judgment circuit 71 which is connected to the light emitting element 28 and the light receiving element 30, there is output after the judgment of the presence or absence of a semiconductor wafer 60 inside the wafer cassette 40 in accordance with the level of the electrical signals from the light receiving element 30. For example, there is the output of the electrical signal W when the light beam 29 is interrupted by a semiconductor wafer 60. After this, in the measurement control means 72 (See FIG. 11), the number of pulses of the electrical signals S is counted while the electrical signals W are being output. Then, the result of this count is compared with a required number which has already been stored and alarm signals ALM are generated when for example, the count result exceeds a required number, and there is operation to control the alarm generation means 73 and the like.

In the case where a semiconductor wafer 60 having a thickness of 0.5 mm, is correctly housed in the horizontal status inside the wafer cassette 40, the light beam 29 is interrupted by the semiconductor wafer 60 while the first arm 24 and the second arm 26 move a distance of 0.5 mm, that is, for between I and II of FIG. 8A and so there is the output of 50 pulses for the electrical signals S. Accordingly, 50 is counted in the measurement control means 72 and there is no generation of the alarm signals ALM if the required number that has been set beforehand is 50.

On the other hand, as shown in FIG. 8B, when the semiconductor wafer 60 is housed at an incline left to right inside the wafer cassette 40, the apparent thickness of the semiconductor wafer 60 is more than 0.5 mm. Here, the light beam 29 is interrupted for between I' and II' of FIG. 8B, and if the measurement control portion 72 counts 150 pulses for example, this number is greater than the required number of 50 pulses and so there is the generation of an alarm signal ALM, and the alarm generation portion 73 operates. At the same time, the thickness is calculated as being 1.5 mm and so it is known that the semiconductor wafer 60 at the position of detection of the wafer is inclined by 1 mm left to right when compared to the horizontal status. In general, for as long as the portion of the orientation flat portion of the semiconductor wafer 60 is not positioned at the portion of the groove 40a, a semiconductor wafer housed in the wafer cassette 40 has practically no inclination in the direction of their length, since the forward and rear directions of the grooves 40a of the wafer cassette 40 are formed in the forward and rear direction which is the direction of waver conveyance.

So that the semiconductor wafers 60 can be easily carried in and out, the groove 40a of the wafer cassette 40 is formed with a taper at the upper end portion of the groove, and the dimension of the thickness of the groove is formed to be slightly wider than the diameter of the semiconductor wafer 60. Accordingly, it is possible that the semiconductor wafer 60 be housed in a direction inclined left to right with respect to the direction of conveyance of the semiconductor wafer 60.

Moreover, when it is judged that the semiconductor wafer 60 is housed in an inclined status, there is the generation of an alarm to make the operator aware of such, and there is also some kind of visual indication that the semiconductor wafer 60 of some step is inclined.

The semiconductor wafers 60 of the second and later steps also have detection performed in the same manner as the first arm 24 and the second arm 26 are raised, and so that it is possible for the present invention to detect whether semiconductor wafers 60 are housed, and whether or not the housed semiconductor wafers 60 are correctly housed in the horizontal direction, for each of the steps (grooves) of the wafer cassette 40.

Moreover, the inclination detection operation described above for the semiconductor wafers 60 is performed while the first arm 24 and the second arm 26 are being moved in the upwards direction but when the side of the wafer cassette 40 has a raising and lowering function, the wafer cassette 40 can be moved instead. In other words, the light emitting element 28 and the light receiving element 30 are moved relative to the semiconductor wafers 60.

When the wafer detection is completed, the first arm 24 and the second arm 26 are retreated from the wafer cassette 40 and the gripper 14 is advanced and if there are semiconductor wafers 60 housed, then those semiconductor wafers 60 are taken out one at a time in the manner described above and conveyance commences. Here, a semiconductor wafer 60 for which it has been judged that it is stored inside the wafer cassette 40 in an inclined status as described above, is either not taken out, or has its position adjusted manually and is then conveyed.

Figure 10:
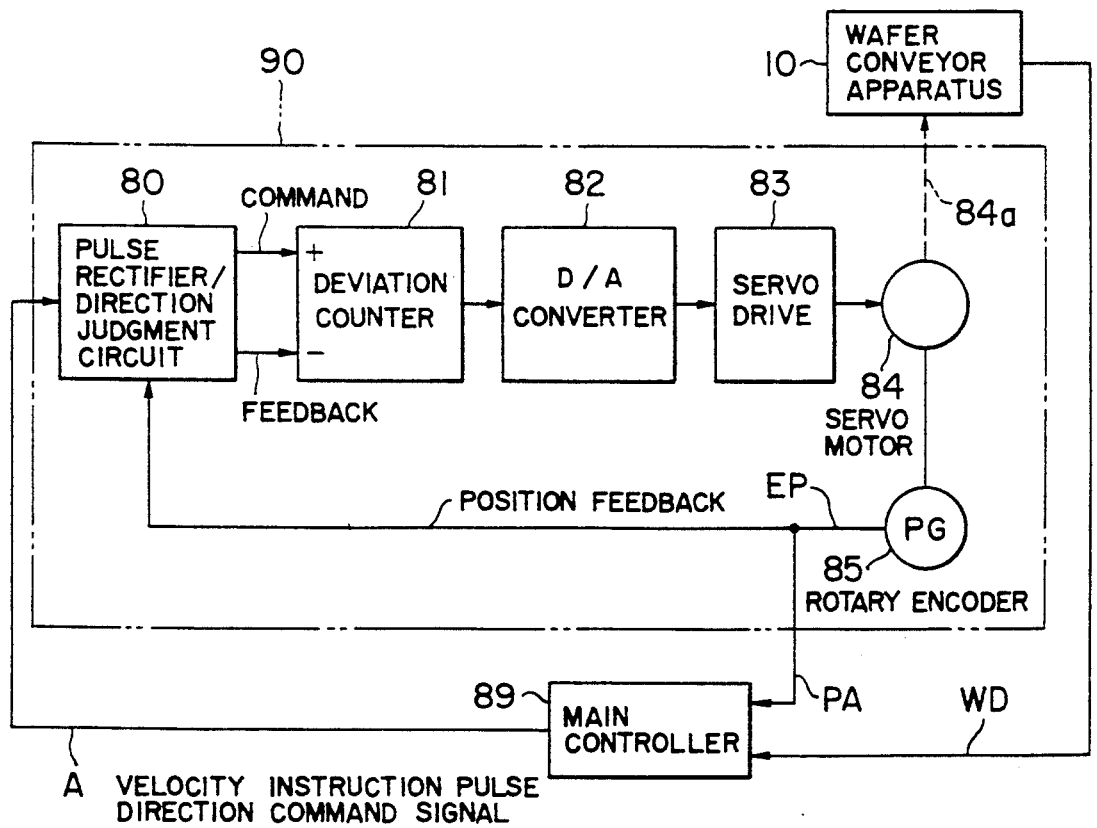
FIG. 10 is a block diagram of a control system of a servo mechanism for performing movement of the wafer conveyor apparatus of the present invention and performing wafer position detection.

FIG. 10 is a block diagram of a control system of a servo mechanism for performing movement of the wafer conveyor apparatus 10 of the present invention and performing wafer position detection. In this control system, the pulse rectifier and direction judgment circuit 80, deviation counter 81, D/A converter 82, servo drive 83, servo motor 84 and rotary encoder 85 configure the servo mechanism 90 that moves the wafer conveyor apparatus 10.

To the deviation counter 81 are input via the direction judgment circuit 80, the instruction pulses of a number corresponding to the distance that the wafer conveyor apparatus 10 is to be moved, that is, the movement amount instruction value from the main controller 89 and the direction command signal. The movement amount instruction value set in the deviation counter 81 is converted into analog movement instruction signals by the D/A converter 82, and these movement instruction signals are input to the servo drive 83, and the servo motor 84 rotates by the output current which corresponds to the movement instruction signals, so that the wafer conveyor apparatus 10 which is coupled to the motor shaft 84a via the transmission mechanism (not shown) is moved a required distance. The direction of movement of the wafer conveyor apparatus 10 corresponds to the direction of rotation of the motor 84.

To the rotation shaft 84a of the servo motor 84 is coupled a rotary encoder 85 and from this rotary encoder 85 are generated pulse signals EP of a frequency and pulse number corresponding to the rotation speed and rotation amount of the motor 84. These pulse signals EP are applied to the deviation counter 81 as position feedback signals via the pulse rectifier and direction judgment circuit 80.

In the position feedback system, the counter value (movement amount instruction value) of the deviation counter 81 is subtracted by the positioned feedback signals (pulse signals EP) and the voltage level of the movement instruction signals that are output from the deviation counter 81 is reduced accordingly, the movement instruction signals are stopped when the counter value of the pulse rectifier and direction judgment circuit 80 reaches zero, and the movement of the wafer conveyor apparatus 10 is stopped. When this occurs, and the wafer conveyor apparatus 10 moves past the required position due to inertia force, the servo lock action enables positioning at the objective position.

The wafer conveyor apparatus 10 moves along a required path by the rotational drive of the servo motor 84. Then, in the wafer position detection mode, the wafer detection mechanism that is incorporated into the wafer conveyor apparatus 10 outputs the wafer detection signals WD that express the presence or absence of a wafer in accordance with each of the positions inside the wafer cassette 40. These wafer detection signals WD from the wafer conveyor apparatus 10 are applied to the main controller 89.

In the manner described above, the main controller 89 sets and inputs instruction pulses and direction command signals that indicate the distance that the wafer conveyor apparatus 10 is to be moved, in the deviation counter 81, receives the wafer detection signals WD from the wafer detection mechanism inside the wafer conveyor apparatus 10 when there is the wafer position detection mode, and also receives the pulse signals PA from the rotary encoder 85 as interrupt signals.

The pulse signals PA of the rotary encoder 85 have one pulse corresponding to a rotation amount of a required angle of the servo motor 84 and also corresponding to a required movement amount of the wafer conveyor apparatus 10. The main controller 89 counts the number of pulses (number of interrupt signals) of the pulse signals PA so that the actual movement position of the wafer conveyor apparatus 10 and the wafer detection mechanism are detected.

In this manner, the main controller 89 uses the output signals PA of the rotary encoder 85 for feedback control in the servo mechanism 90 as the basis for monitoring the movement position of the wafer conveyor apparatus 10 and the wafer detection mechanism. Accordingly, by simply setting and inputting the movement amount to the servo mechanism 90, it is possible to have position control with a high degree of accuracy when compared to the method where there is movement control without monitoring of the actual movement position of the moving body and the movement status.

Figure 11:
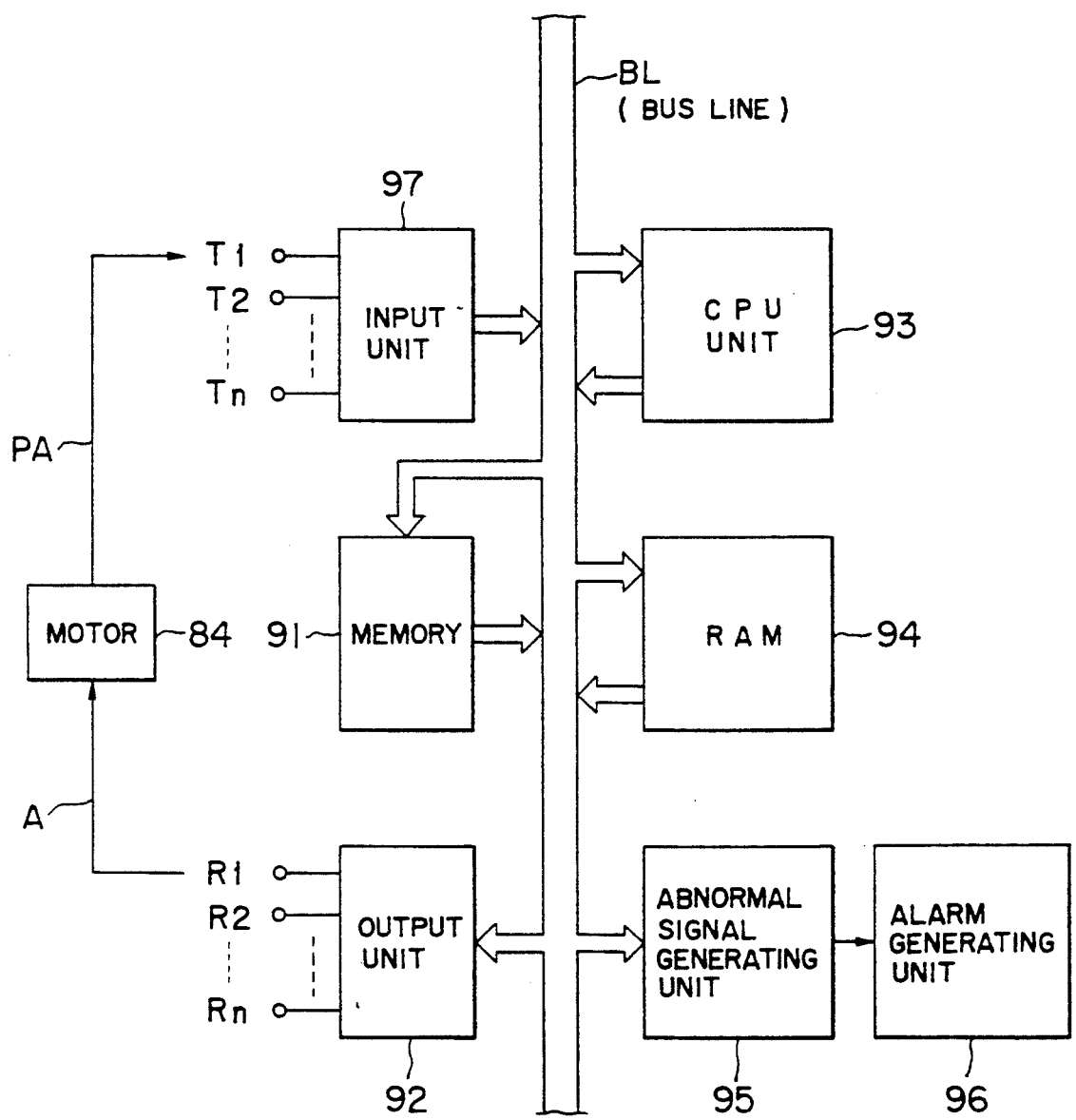
FIG. 11 is a system diagram of a control system configuring the measurement control portion shown in FIG. 9.

In addition, FIG. 11 is a system diagram of a control system configuring the measurement control portion shown in FIG. 9.

In this system diagram, the bus line (BC) is connected to a host computer (not shown), and this bus line (BC) is connected to the following units.

To the input portion T1 of the input unit 97 are input pulse signals such as signals of a rotary encoder 85 for example, corresponding to the speed of rotation of the Z-axis drive motor 84, and to the input portion T2 are input signals corresponding to the presence or absence of a wafer 60, from the judgment circuit 71 which is connected to the light emitting element 28 and the light receiving element 30.

From the output portion R1 of the output unit 92 are taken signals for either the drive or the stop of the Z-axis drive motor 84.

Figure 12:
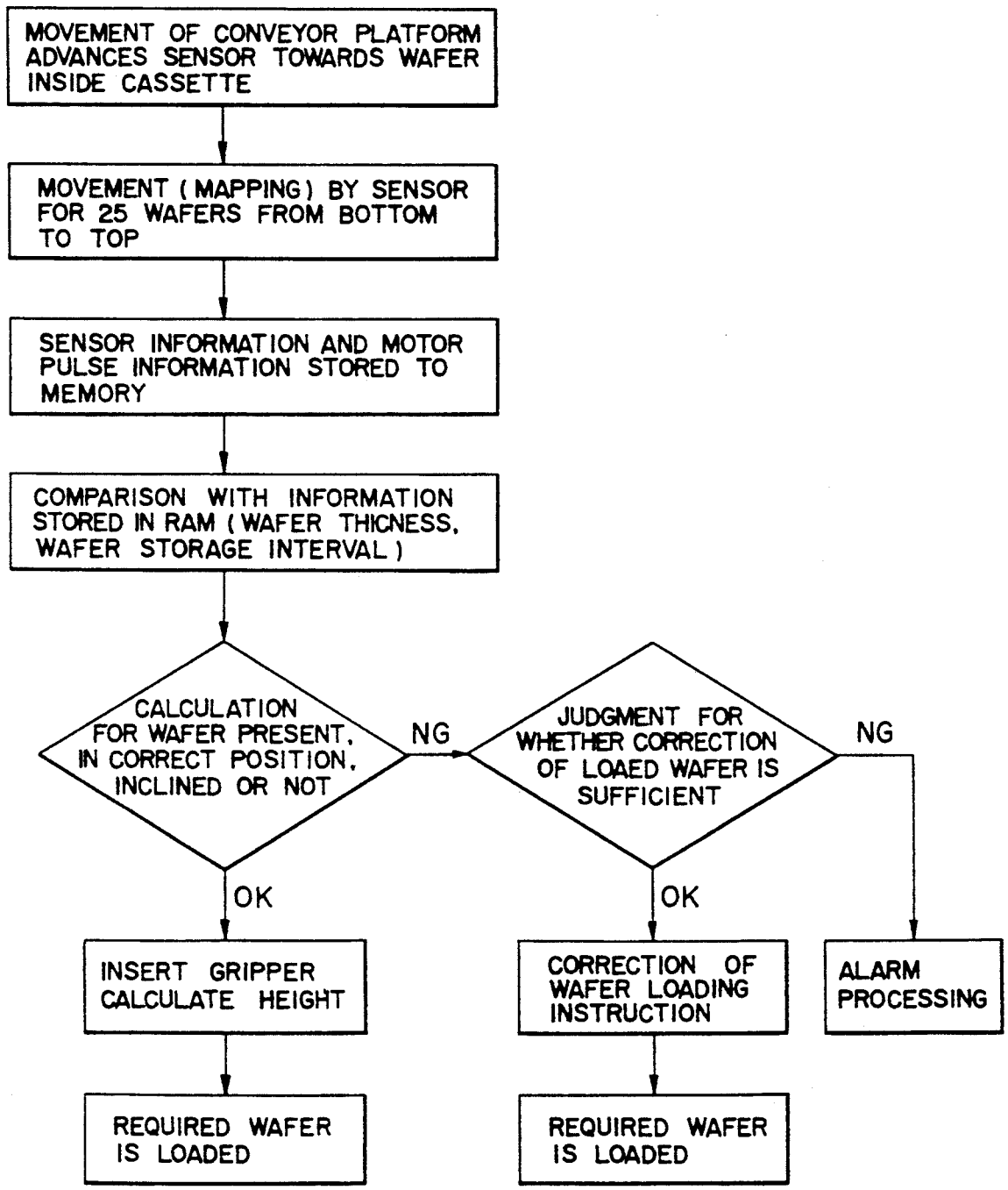
FIG. 12 is a flow chart showing each of the steps of a method using the wafer conveyor apparatus of the present invention for detecting a wafer inclination inside a wafer cassette.
Figure 13:
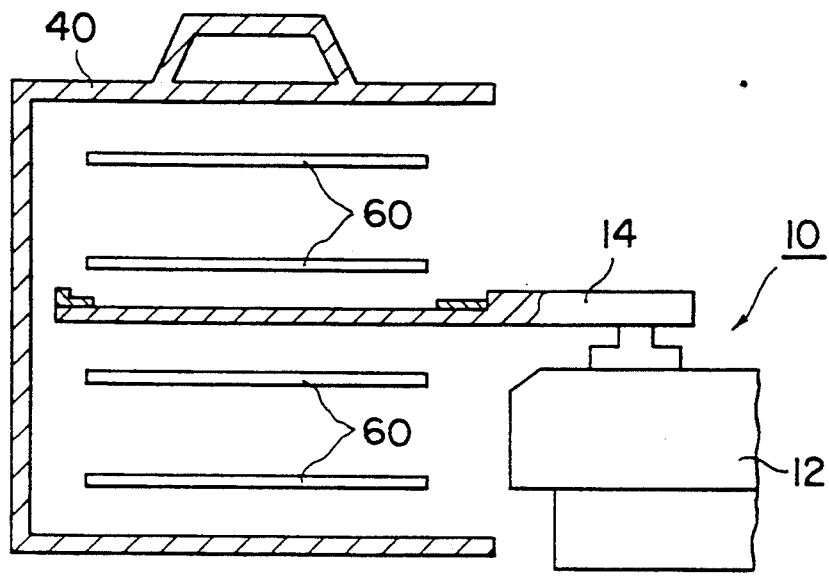
FIG. 13 is a conceptual longitudinal sectional view for describing a conventional wafer conveyor apparatus.
Figure 14:
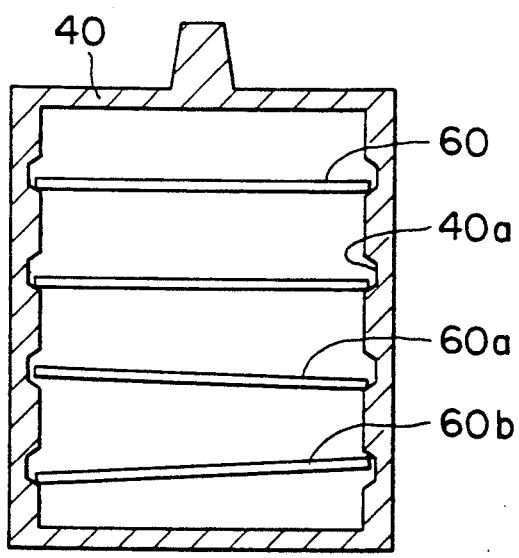
FIG. 14 is a front view showing the status of semiconductor wafers housing inside a wafer cassette.

In the memory 91 are stored beforehand information relating to the thickness of the semiconductor wafers 60 and the number of semiconductor wafers 60 stored in the wafer cassette 40, and a program for the processing and which corresponds to the flow shown in FIG. 12. The RAM 94 stores one portion of the data input from the input unit 97 and also temporarily stores various types of data that are sent via the bus line (BC).

The alarm generation unit 96 is driven by the abnormal signal generation unit 95 and generates an alarm on the basis of the data that is sent via the bus line.

The CPU unit 93 uses the information that is stored beforehand in the memory 91 as the basis for the output of signals to the output portion R1 of the output unit 92, drives the Z-axis drive motor 84 and the light emitting element 28 and the light receiving element 30 scan the wafer region that houses the semiconductor wafers 60 inside the cassette 40.

Then, the pulse signals of the Z-axis of the drive motor 84 and which are input to the input unit 90 and the wafer presence signals of the judgment circuit 71 are stored in the memory 91 via the bus line (BC). Then, the data in the memory 91 and the RAM 94 are compared and a judgment is made for whether both data are the same (which indicates that a wafer is correctly housed) or whether both data are not the same (which indicates that a wafer is housed at an incline).

Then, in a normal case, this judgment result is used as the basis for performing the following operation on the basis of the data that is stored in the RAM 94, and in the case of an abnormality, for driving the abnormal signal generation unit 95.

Furthermore, FIG. 12 is a flow chart showing each of the steps of a method using the wafer conveyor apparatus of the present invention for detecting a wafer inclination inside a wafer cassette 40.

As has been described above, according to the wafer conveyor apparatus 10 of the present invention, in addition to enabling the centering and conveying of the semiconductor wafer 60 for the next process, it is also possible to have simultaneous judgment in a single operation for each step of the wafer cassette 40, for whether or not the semiconductor wafer 60 is housed, and for whether or not each housed semiconductor wafer 60 is correctly stored in the horizontal direction.

In addition, semiconductor wafers 60 for which it is judged that they are housed in the wafer cassette 40 in an inclined status, are not taken out by the gripper 14, and their carrying out after their housing position inside the wafer cassette 40 has been corrected enables the destruction of semiconductor wafers 60 and the generation of dust due to the semiconductor wafers 60 being carried from the wafer cassette 40 to both be prevented. In addition, the gripper 14 is inserted at a safe height, such as for example, a height lower than the position of the bottommost portion of the semiconductor wafers 60.

However, only one of the judgement for whether or not the semiconductor wafer 60 is housed inside the wafer cassette 40 and the judgment for whether or not a housed semiconductor wafer 60 is correctly housed in the horizontal status can be performed. For example, when there is no possibility that a semiconductor wafer 60 is inclined and housed in the wafer cassette 40, only the judgment for whether or not a semiconductor wafer 60 is housed inside the wafer cassette 40 need be performed.

In addition, in the present embodiment, the configuration enables advancing and retreating movement of the first arm 24 and the second arm 26 with respect to the direction of conveyance of the wafers 60 but such a mechanism is not necessarily needed. For example, the first arm 24 and the second arm 26 can be provided in the direction opposite the gripper 14, the wafer conveyor apparatus 10 retreated once from the wafer cassette 40 after the performance of detection as described above and then advanced it once again after the conveyor platform 12 has been rotated 180 degrees. If this is done, then if the semiconductor wafer 60 is to be taken out by the gripper 14, then the first arm 24 and the second arm 26 do not obstruct the operation of the gripper 14 even if there is no mechanism to advance and retreat the first arm 24 and the second arm 26.

Furthermore, in the present embodiment, the description was given for when the light emitting element 28 and the light receiving element 30 were respectively mounted to the distal ends of the first arm 24 and the second arm 26 but the configuration can also be such that the light beam 29 which is irradiated to the left and right with respect to the direction of conveyance of the wafer is interrupted by the semiconductor wafer 60. For example, the light emitting element 28 and the light receiving element 30 can be arranged in the vicinity of the side of the conveyor platform 12 of the wafer conveyor apparatus 10 and optical fiber used to lead the light to the distal end of the first arm 24 and the second arm 26, or a light reflecting body can be arranged at the distal end portion so that the same detection is performed.

In addition, the wafer detection was described above for the case of operation for detection of the semiconductor wafers 60 inside the wafer cassette 40 from the bottommost step in order to the uppermost step but conversely, the detection can start from the topmost step and proceed towards the bottommost step.

Moreover, even when the orientation flat portion 61 (cutout portion) formed in the outer periphery of the semiconductor wafer 60 is positioned at the wafer carrying in and out openings of the wafer cassette 40, the configuration can be such that the second arm 26 can move so that the light beam 29 can be irradiated from the orientation flat portion 61 to the side of the center to enable detection.

In the status where the light beam 29 is interrupted by the orientation flat portion of the semiconductor wafer 60, there is still no obstruction when there is the detection of the presence of the semiconductor wafer 60. However, when the inclination of the semiconductor wafer 60 is measured, it is possible to detect the presence or absence of inclination, and when there is, there is the generation of an error by measurement smaller than the actual measurement. Accordingly, the direction of housing of the semiconductor wafers 60 inside the wafer cassette 40 is desirably such that they are aligned beforehand so that the orientation flat portion 61 does not obstruct the light beam 29.

As has been described in detail above, according to the wafer conveyor apparatus 10 of the present invention, it is possible to detect with extreme accuracy whether or not a wafer 60 to be conveyed is housed in a wafer cassette 40. Accordingly, it is not necessary to provide a sensor to each wafer cassette 40 and so it is possible to lower the overall cost of the semiconductor manufacturing apparatus.

In addition, according to the wafer inclination detection method of the present invention, it is possible to detect the status of inclination of wafers 60 housed in a wafer cassette 40 and accordingly, it is possible to prevent the inclination of wafers 60 and the generation of dust due to wafers 60 in such a status being carried from a wafer cassette 40.

Moreover, it is possible to detect the inclination when an orientation flat portion 61 of a semiconductor wafer 60 is positioned at a portion of a groove 40a of a wafer cassette 40, and when the semiconductor wafer 60 is inclined in the front and rear directions.

More specifically, the groove 40a described above is formed at a regulated position in the wafer cassette 40 and so there is a comparison between this regulated position and the actual height position measured for the semiconductor wafer 60, and this difference is measured to detect the inclination of the semiconductor wafer 60 in the forward and rear direction.

For example, in a case where the actual height position of the semiconductor wafer 60 is lower than the regulated position, it is possible to detect the status where the forward edge of the semiconductor wafer 60 is lower and conversely, when the actual height position of the semiconductor wafer 60 is higher, it is possible to detect the status where the forward edge is higher. This detection is extremely effective when semiconductor wafers 60 are to be carried into and out of arbitrary positions in the wafer cassette 40.

What is claimed is:

1. A wafer conveyor apparatus comprising:
    a wafer holding means for conveying wafers housed in a wafer cassette and
    a wafer detection means for detecting wafers, said wafer detection means including:
        a first arm provided with a light emitting means;
        a second arm formed integrally with said first arm and provided with a light receiving means that detects light emitted from said light emitting means and outputs information relating to said detected light; and
        a judgement means for judging the presence or absence or a housing status of a wafer inside wafer cassette on the basis of said output information of said light receiving means where said first and second arms are inside a wafer cassette in use.

2. The wafer conveyor apparatus according to claim 1, wherein said first arm and said second arm are integrally provided to a wafer conveyor platform so that a wafer is detected from left and right directions with respect to a wafer's direction of conveyance to said wafer cassette.

3. The wafer conveyor apparatus according to claim 1, wherein said first arm and said second arm are positioned for detection at a side of a center of an orientation flat portion of a wafer.

4. The wafer conveyor apparatus according to claim 1, wherein said first arm and said second arm are provided to move upward and downward in a direction of a thickness of a wafer upon detection.

5. The wafer conveyor apparatus according to claim 1, wherein said light emitting means includes a light emitting diode mounted to a distal end portion of said first arm, and said light receiving means includes a phototransistor mounted to a distal end portion of said second arm.

6. The wafer conveyor apparatus according to claim 1, wherein said first arm and said second arm are freely movable in a direction of conveyance to a wafer cassette.

7. The wafer conveyor apparatus according to claim 1, wherein said wafer holding means includes a gripper which is formed so as to freely advance and retreat with respect to a conveyor platform.

8. The wafer conveyor apparatus according to claim 7, wherein a step portion provided at a distal end portion of said gripper and a side surface of a wafer centering member mounted to said conveyor platform holds and centers said wafer from its outer peripheral surfaces.

9. A method for detecting the presence or absence of a wafer stored in a wafer cassette by a wafer conveyor apparatus, comprising the steps of:

positioning both a first arm integrally provided to a conveyor platform having a light emitting means provided at its distal end and a second arm integrally provided to said conveyor platform having a light receiving means provided at its distal end above or below an outside of an outer peripheral side of a wafer by inserting said first and second arms into a wafer cassette and;

relatively moving said first arm and said second arm in a direction of a thickness of a wafer, while radiating light from said light emitting source and detecting said light by said light receiving means to detect the presence or absence of said wafer.

10. A method for detecting an inclination of a wafer stored in a wafer cassette by a wafer conveyor apparatus, comprising the steps of:

positioning both a first arm integrally provided to a conveyor platform having a light emitting means provided at its distal end and a second arm integrally provided to said conveyor platform having a light receiving means provided at its distal end above or below an outside of an outer peripheral side of a wafer by inserting said first and second arms into a wafer cassette;

relatively moving said first arm and said second arm in a direction of a thickness of said wafer, while radiating light from said light emitting source and detecting said light by said light receiving means to measure an apparent thickness of said wafer;

comparing said apparent thickness of said wafer as obtained by said measurement with an actual thickness of said wafer to thereby detect an inclination of a housed wafer; and performing at least one of movement of said wafer, correction of housing of said wafer, and alarm processing depending upon a detected inclination of said wafer.

11. A method for detecting an inclination of a wafer stored in a wafer cassette by a wafer conveyor apparatus, comprising the steps of:

moving a first arm integrally provided to a conveyor platform and having a light emitting means provided at its distal end and a second arm provided to said conveyor platform and having a light receiving means provided at its distal end, and positioning said first and second arms above or below an outside of an outer peripheral side of said wafer by inserting said first and second arms into said wafer cassette;

relatively moving said first arm and said second arm in a direction of a thickness of said wafer, and radiating light from said light emitting source and detecting said light by said light receiving means to measure an actual thickness of said wafer;

comparing said apparent thickness of said wafer as obtained by said measurement with a regulated height positioned of said wafer to thereby detect an inclination of a housed wafer; and performing at least one of movement of said wafer, correction of housing of said wafer, and alarm processing depending upon a detected inclination of said wafer.

* * * * *

UNITED STATES PATENT AND TRADEMARK OFFICE
CERTIFICATE OF CORRECTION

PATENT NO. : 5,239,182

DATED : August 24, 1993

INVENTOR(S) : Naoki Mizutani

It is certified that error appears in the above-identified patent and that said Letters Patent is hereby corrected as shown below:

On the Title Page, item [73] should read as follow:

--[73] Assignee: Tokyo Electron Kabushiki Kaisha, Tokyo-to, Japan; Tokyo Electron Saga Kabushiki Kaisha, Saga-ken, Japan--.

Signed and Sealed this

Twenty-third Day of August, 1994

Attest:

BRUCE LEHMAN

Attesting Officer     Commissioner of Patents and Trademarks